United States Patent [19]
de Cremoux

[11] 3,979,587
[45] Sept. 7, 1976

[54] COMPONENT FOR LIGHT DETECTION AND EMISSION
[75] Inventor: Baudoin de Cremoux, Paris, France
[73] Assignee: Thomson-CSF, Paris, France
[22] Filed: May 27, 1975
[21] Appl. No.: 580,756

[30] Foreign Application Priority Data
May 28, 1974 France .............................. 74.18461

[52] U.S. Cl. ................................ 250/211 J; 357/19
[51] Int. Cl.² ......................................... H01J 39/12
[58] Field of Search ......................... 357/19, 29, 30; 250/211 R, 211 J, 213 R, 551

[56] References Cited
UNITED STATES PATENTS

| 3,283,160 | 11/1966 | Levitt et al. | 250/213 R |
| 3,351,827 | 11/1967 | Newman | 357/30 |
| 3,748,480 | 7/1973 | Coleman | 250/211 J |
| 3,814,993 | 6/1974 | Kennedy | 250/211 J |
| 3,881,113 | 4/1975 | Rideout et al. | 250/551 |
| 3,894,295 | 7/1975 | Shannon et al. | 357/19 |

Primary Examiner—David C. Nelms
Attorney, Agent, or Firm—Cushman, Darby & Cushman

[57] ABSTRACT

A component formed by the superimposition of a photo-emissive diode and a photodetector diode, is formed by four semi-conductor layers deposited upon one substrate. The photodetector diode is above the photo-emissive diode which is made of a material transparent in the operating wavelength range.

12 Claims, 4 Drawing Figures

COMPONENT FOR LIGHT DETECTION AND EMISSION

In telecommunication field, there is a growing tendency towards the use of optical fibres; these fibres guide light rays emitted by sources which often take the form of electroluminescent diodes. The waves are modulated and carry a signal which is demodulated at the receiving end by a photodetector diode.

Those skilled in the art will be aware that electroluminescent diodes emit light waves at a frequency which depends upon the material of which they are made, when they are forward-biased. Photodiodes are reverse-biased diodes, which produce currents as a function of the intensity of the light radiation directed onto them. These diodes, likewise, only operate within certain frequency bands. Generally speaking, these two kinds of components are utilised in the one case at the transmitting station and in the other at the receiving station.

In the case where each station operates as a receiver as well as a transmitter, it must have its electroluminescent diode and its photodiode. Accordingly, a large number of components is required.

The object of the present invention is a component which, depending upon the way in which it is biased, can operate alternatively either as an electroluminescent diode or as a photodetector diode, thus making it possible to considerably reduce the number of components required in each station.

The component in accordance with the invention comprises two semiconductor junctions, one being an emissive junction, and the other a detector junction, integrated into the same substrate and superimposed, the materials of which these emissive and detector junctions are made being chosen in such a fashion that the radiation received by the detector zone is totally absorbed by said zone, whilst the emissive zone is transparent to this radiation.

The invention will be better understood from a consideration of the ensuing description and by reference to the attached drawings where:

In all the figures, similar references designate similar elements.

Figure 1:
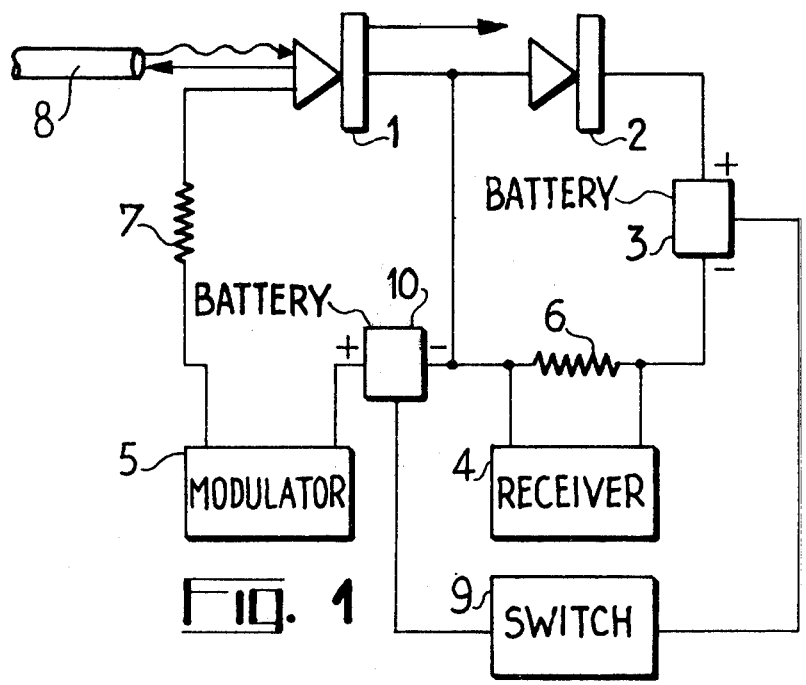
FIGS. 1 and 2 illustrate block diagrams of two examples of devices using the structures in accordance with the invention.
Figure 2:
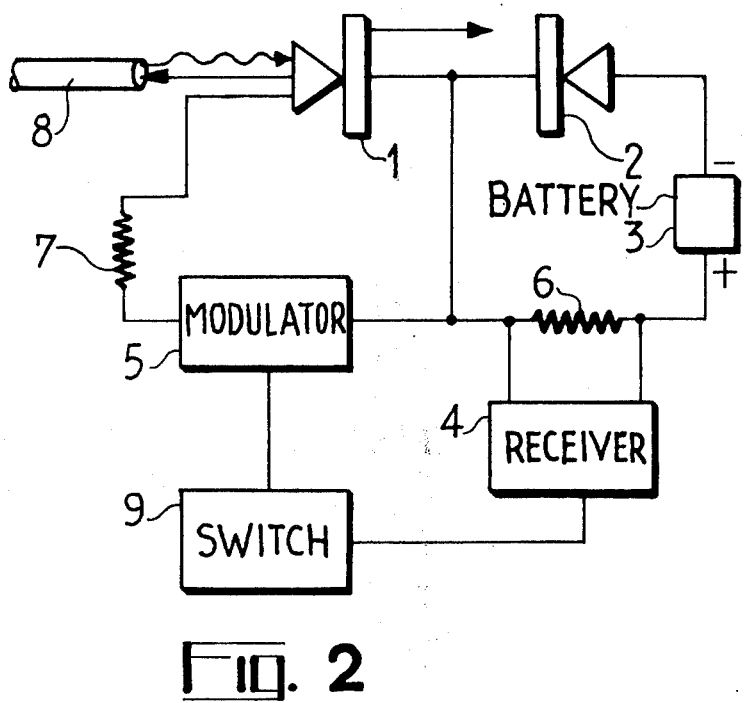

In FIG. 1, two diodes, one a photo-emissive diode 1 and the other a photodetector diode 2, are connected in series in the same direction, and head-to-tail in FIG. 2, and are also coupled to the same optical fibre or to the same bunch of optical fibres, 8. These two diodes are connected in two independent circuits. The diode 1 which is the photo-emissive diode, is forward-biased by the battery 10, the battery being in series with the modulating source 5 and a resistor 7. The photodetector diode 2 is reverse-biased across a load resistor 6, the terminals of said resistor being connected to the demodulator 4. A switch 9 alternately disconnects the two batteries 3 and 5.

The diode 1, in accordance with the invention, is transparent to the radiation received by the optical fibre.

The operation of the system of FIG. 1 is as follows:

First state: the switch 9 disconnects the battery 3 and connects the battery 10. The diode 1 is forward-biased and emits light radiation modulated by the device 5. The system then operates as a transmitter.

Second state: The switch 9 disconnects the battery 10. The radiation transmitted by the optical fibre 8 is received across the diode 1 by the diode 2 which is reverse-biased. The latter demodulates the radiation and the output signal picked off across the load resistor 6 is received by the receiver 4.

In the circuit of FIG. 2, the same battery 3 is used for reverse biasing diode 2 and direct biasing diode 1. The switch 9 in the first state short circuits receiver 4 and resistor 6, and the current path comprises resistor 7 modulator 5 and diode 1. The circuit acts as a transmitter.

In the second state, modulator 5 and resistor 7 are disconnected. Diode 2 is reverse biased, and the circuit acts as a receiver.

Figure 3:
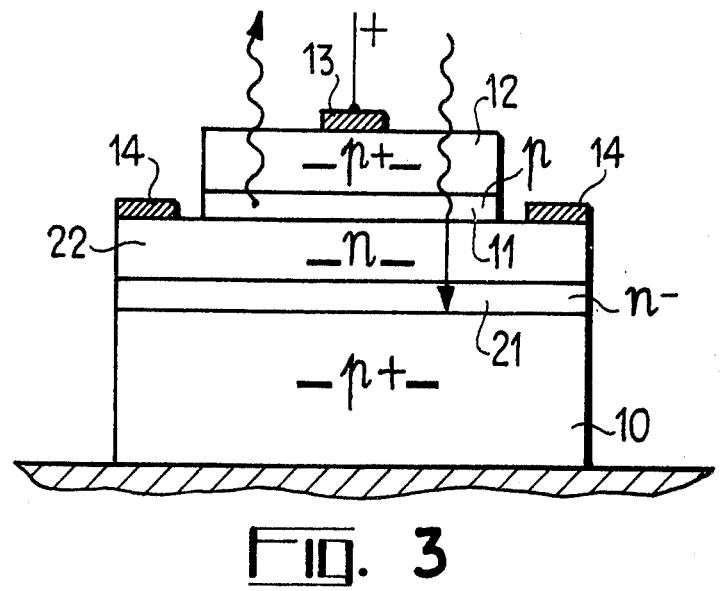
FIGS. 3 and 4 illustrate two examples of structures in accordance with the invention, as utilised in FIG. 2.
Figure 4:
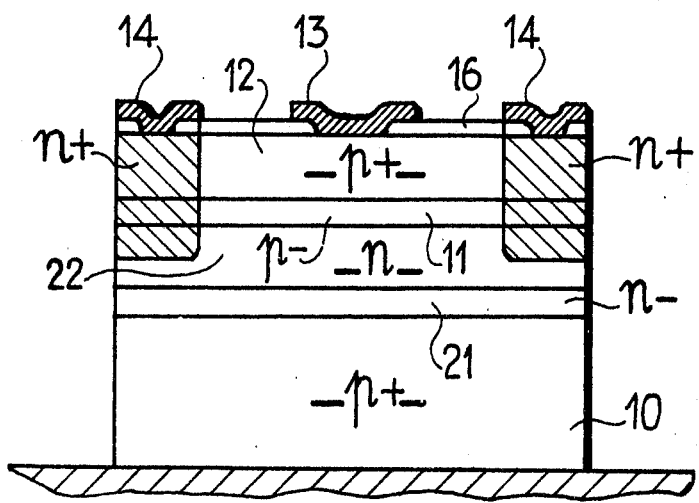

FIGS. 3 and 4 respectively illustrate embodiment of diodes 1 and 2 integrated into the same substrate 1.

From the foregoing considerations, it will be evident that the electroluminescent diode section must be transparent within the band of frequencies utilised for transmission, whereas the photodiode section must absorb this radiation.

In accordance with the invention, the diodes are made of gallium arsenide.

In FIG. 3, the assembly of diodes of FIG. 2 has been shown, that is to say an assembly of diodes 1 and 2 connected head-to-tail. It comprises a substrate 10 of $p+$ type GaAs having an acceptor impurity concentration of better than $10^{18}$ At/cm$^3$.

On this substrate there are successively deposited by an epitaxial technique carried out in the liquid phase in a gallium bath, four layers:

The first layer 21 deposited upon the substrate 10, is the detector layer. Its $n$-type free charge carrier density is less than $10^{17}$ At/cm$^3$. It is made of GaAs. Its thickness is of the order of 2 to 3 microns.

The second layer, 22, which constitutes with the first layer and the substrate, the photodiode, is produced by the addition to the bath of aluminium. Its formula is $Ga_{1-x} Al_x$ where $x \geq 0.2$. It is of $n$-type material with a donor impurity concentration of better than $10^{18}$ At/cm$^3$. Its thickness can be comprised between 1 and 10 microns.

The third layer, 11, or the emissive layer, is $p$-doped (using germanium for example). Its composition formula is $Ga_{1-y} Al_y As$. Its thickness is between 0.1 and 1 micron; $y$ is close to 0.1.

The fourth layer, which has the same or substantially the same composition as the second, is of $p+$ type with a donor density of the order $10^{18}$ At/cm$^3$; its thickness ranges between 1 and 10 microns.

The two extreme contacts of the structure are formed upon the substrate and by a metal deposit 13 located on the zone 12.

The intermediate contact 14 which has to be formed on the zone 22, is produced at the periphery of this zone following selective etching of the upper zones; this etching can be carried out by any of the known processes used in "mesa" etching techniques. It is also possible, as shown in FIG. 4, to carry out a diffusion or implantation operation using $n+$ type material, across the zones 12, 11, in order to reach the zone 22, a metal deposit 14 being formed across an implantation window created an insulating transparent layer 16.

The operation of the system is as follows:

In order to receive the rays emitted by the optical fibre, a voltage is applied between the contact 14 and the substrate. This voltage blocks the PIN diode formed by the substrate (P zone), the layer 21 (I zone), the layer 22 (N zone). The light rays coming from the optical fibre pass on the one hand through the zones 11 and 12 and on the other through that 22, without absorption, and are absorbed by the zone 21 which operates as a detector.

To emit light signals, a direct biasing voltage is applied between the contact 13 and the contact 14, which voltage drives the diode, formed by the n-type layer 21 on the one hand, and the two layers 12 and 14 respectively of p and p+ type, on the other, conductive. The zone 11 emits light which passes through the layer 12 without absorption, said layer being coupled as seen before, to the optical fibre.

Self-evidently, the system can only operate in an alternating fashion, the layer 21 experiencing the radiation emitted by the layer 11.

Of course, the circuit described has been given purely by way of non-limitative example.

In the examples described above, the following performance figures have been achieved:

| | |
|---|---|
| pass band at emission and reception | 0 – 100 MHz |
| quantum efficiency at emission | $\eta\, e_m = 0.01$ |
| quantum efficiency at reception for a wavelength of the order of 0.80 microns. | $\eta\, det = 0.5$ |

What I claim is:

1. A solid-state light emitter and receiver component comprising superimposed upon one and the same substrate an electroluminescent diode and a photodiode, said electroluminescent diode and said photodiode operating respectively in a first and in a second light frequency band, said electroluminescent diode being transparent vis-a-vis said second light frequency band, and means for alternately rendering said electroluminescent conducting and said photodiode blocked.

2. A component as claimed in claim 1 said electroluminescent diode and said photodiode comprising respectively a first and a second junction, and first, second and third metal contacts respectively upon said substrate and said first and second junctions.

3. A component as claimed in claim 2 wherein said first and second junctions are conductive when voltages of the same polarity are applied thereupon.

4. A component as claimed in claim 2 said first and second junctions are conductive and blocked respectively for voltages of same polarities applied thereupon.

5. A component as claimed in claim 4, comprising superimposed upon one and the same substrate of a first conductivity type, a first layer of said same conductivity type, a second layer of a second conductivity type which is the opposite to the first, a third layer of the first conductivity type and a fourth layer of the first conductivity type.

6. A component as claimed in claim 5, wherein the first conductivity type is p type and the second n type.

7. A component as claimed in claim 6, wherein said first layer is weakly doped and, with said substrate and said second layer, forms a PIN photodiode, the first layer being absorbing in said frequency band.

8. A component as claimed in claim 7, wherein said third layer is weakly doped and forms the source of light emission of said electroluminescent diode.

9. A component as claimed in claim 8, wherein said substrate is made of gallium-arsenide with a doping level at least equal to $10^{18}$ At/cm$^3$, said first layer has a thickness of 1 to 3 microns and a doping level of less than $10^{17}$ At/cm$^3$, said second layer has a doping level greater than $10^{18}$ At/cm$^3$ and a thickness of 1 to 10 microns with a composition corresponding to the formula Ga Al$_x$ As$_{1-x}$ where $x$ at least equal to 0.2, said third layer has germanium doping and a thickness of the order of 0.1 to 1 microns, its composition satisfying the formula Ga$_{1-y}$Al$_y$ As, where $y$ substantially equal to 0.1, and the fourth layer has the same composition as the second, and a thickness of 1 to 10 microns.

10. A component as claimed in claim 9, wherein said electrical contacts are formed, the first on the substrate, the second on the second layer and the third on the fourth layer.

11. A component as claimed in claim 10, wherein said second contact is at the periphery of said second layer.

12. A component as claimed in claim 10, wherein said second contact is a deep n zone diffused across said first and fourth layers.

\* \* \* \* \*